(12) United States Patent
Greb et al.

(10) Patent No.: US 8,395,409 B2
(45) Date of Patent: Mar. 12, 2013

(54) TESTING FOR MULTIPLEXER LOGIC ASSOCIATED WITH A MULTIPLEXED INPUT/OUTPUT PIN

(75) Inventors: Karl F. Greb, Sugar Land, TX (US); Sunil S. Oak, Sugar Land, TX (US); Balatripura S. Chavali, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/329,464

(22) Filed: Dec. 19, 2011

(65) Prior Publication Data
US 2012/0319725 A1 Dec. 20, 2012

Related U.S. Application Data

(60) Provisional application No. 61/427,069, filed on Dec. 23, 2010.

(51) Int. Cl.
*H03K 19/00* (2006.01)

(52) U.S. Cl. .................. 326/16; 326/9; 326/14; 326/82

(58) Field of Classification Search .................. None
See application file for complete search history.

(56) References Cited

U.S. PATENT DOCUMENTS 8,327,199 B1 * 12/2012 Dastidar et al. .............. 714/724
2003/0160651 A1 * 8/2003 Lin et al. ......................... 330/2

* cited by examiner

*Primary Examiner* — Anh Tran
(74) *Attorney, Agent, or Firm* — John R. Pessetto; W. James Brady; Frederick J. Telecky, Jr.

(57) ABSTRACT

An integrated circuit includes a first multiplexer (mux) with multiple inputs and configured to produce a mux output signal. The electronic circuit also includes a first gated buffer to receive the mux output signal from the first multiplexer and produce a first gated buffer output signal, a second gated buffer to receive the first gated buffer output signal and to produce a second gated buffer output signal to be provided to a pin, and a receive buffer. The receive buffer is coupled to the pin and receives an input signal from the pin. The electronic circuit operates in a test mode in which the second gated buffer is disabled preventing a test signal provided to an input of the first mux from reaching the pin. Instead, the test signal is provided through the first mux to the first gated buffer and to the receive buffer thereby testing the first mux.

12 Claims, 4 Drawing Sheets

TESTING FOR MULTIPLEXER LOGIC ASSOCIATED WITH A MULTIPLEXED INPUT/OUTPUT PIN

CROSS-REFERENCE TO RELATED APPLICATION

The present application claims priority to U.S. Provisional Patent Application No. 61/427,069, filed on Dec. 23, 2010; which is hereby incorporated herein by reference.

BACKGROUND

Integrated circuits are used in a huge variety of applications. Some applications are mission critical and/or have safety implications. The ability to test integrated circuits after fabrication of the integrated circuits and while the integrated circuits have been installed in their applications (e.g., integrated circuit embedded in system), particularly those used in mission critical applications or that have safety implications, is desirable. Pin multiplexing ("muxing") for a chip is a technique which allows software to select any of multiple internal device signals to be provided to an input/output (I/O) pin. As such, a given I/O pin may be used to transmit any of multiple output signals to devices external to the chip. Multiplexer logic is typically used to multiplex the various output signals. Pin muxing allows considerable flexibility but introduces extra logic (multiplexer logic) susceptible to improper functionality.

SUMMARY

The problems noted above are solved in large part by providing for internal testing of multiplexer logic in an integrated circuit that is capable of pin muxing. By testing the multiplexer logic, the integrated circuit helps to ensure proper device operation.

Some embodiments are directed to an integrated circuit (IC) that comprises a first multiplexer (mux) with multiple inputs and configured to produce a mux output signal. The IC also comprises a first gated buffer, a second gated buffer and a receiver input buffer. The first gated buffer is configured to receive the mux output signal from the first multiplexer and produce a first gated buffer output signal. The second gated buffer is configured to receive the first gated buffer output signal and configured to produce a second gated buffer output signal to be provided to a pin. The receive input buffer is coupled to the pin and configured to receive an input signal from the pin. The IC can operate in a test mode in which the second gated buffer is disabled thereby preventing a test signal provided to an input of the first mux from reaching the pin. The test signal is provided instead through the first mux to the first gated buffer and to the receive buffer thereby testing at least the first mux.

Other embodiments are directed to an IC that comprises a first multiplexer (mux) with multiple inputs and configured to produce a mux output signal, a gated buffer configured to receive the mux output signal from the first multiplexer and produce a gated buffer output signal, and a latch configured to receive the gated buffer output signal and configured to produce a latched output signal to be provided to a pin. The IC also comprises a receive input buffer coupled to said pin and configured to receive an input signal from the pin. The IC operates in a test mode in which the latch is configured to latch the gated buffer output signal to be provided to the pin as an output signal from the pin while a test signal is provided to an input of the mux from reaching the pin. The test signal is provided instead through the mux to the gated buffer and to the receive input buffer without the test signal being provided to the pin.

Other embodiments are directed to a method of performing a loop back test on multiplexer logic in an integrated circuit. The multiplexer logic contains a multiplexer and is coupled to an input/output pin for multiplexing data output signals to the pin. The method comprises causing an output latch to latch an output signal from a multiplexer to perpetuate the output signal from the multiplexer at the pin while internal loop back testing occurs. The method further comprises performing an internal loop back test by providing a test signal to the multiplexer, looping the test signal from an output of the multiplexer back to a receive buffer, and comparing the looped back test signal to the provided test signal to check for an error. The method also comprises that, upon completion of the internal loop back test, causing a state of the output latch to change thereby to provide a data signal from the multiplexer to the pin.

Other embodiments are directed to a method of performing a loop back test on multiplexer logic in an integrated circuit. The multiplexer logic contains a multiplexer and is coupled to an input/output pin for multiplexing data output signals to the pin. The method comprises causing an output gated buffer to prevent a signal from the multiplexer from reaching a pin, providing a test signal to the multiplexer, looping the test signal from an output of the multiplexer back to a receive input buffer, comparing the looped back test signal to the provided test signal to check for an error, and upon completion of a test, causing a state of the gated output buffer to change thereby to provide a data signal from the multiplexer to the pin.

BRIEF DESCRIPTION OF THE DRAWINGS

For a detailed description of various examples, reference will now be made to the accompanying drawings in which.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
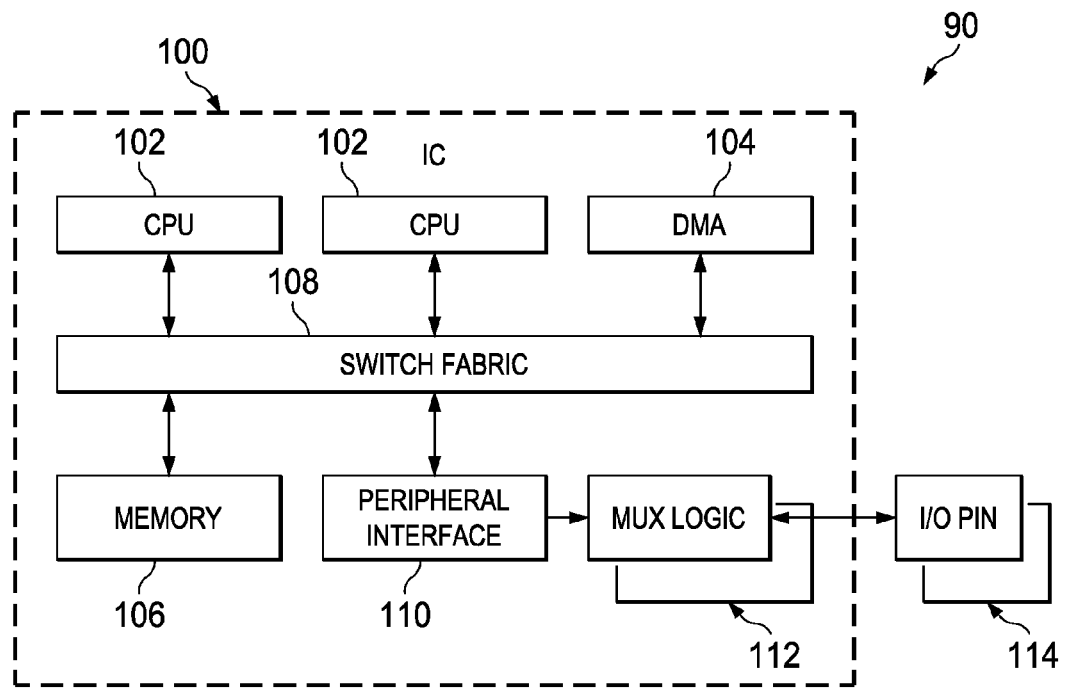
FIG. 1 shows a system in accordance with various embodiments of the invention.

FIG. 1 illustrates an embodiment of an electronic device 90. Electronic device 90 preferably comprises an integrated circuit (IC) 100. It should be understood, however, that the principles discussed herein can apply to circuits other than ICs.

Integrated circuit 100 is shown in FIG. 1 coupled to one or more input/output (I/O) pins 114 via pads (not explicitly shown). In the example of FIG. 1, the IC 100 includes one or more central processing unit (CPU) cores 102, a direct memory access (DMA) engine 104, memory 106, a peripheral interface 110, and multiplexer (mux) logic 112 interconnected by way of switch fabric 108. The function(s) performed by the IC 100 can be any of a variety of functions as desired. In one example, the IC 100 controls a system within a vehicle such as the antilock brake system or power steering system, but in general can perform any desired function(s). In some embodiments, IC 100 performs a mission critical function, but need not perform mission critical functions in other embodiments. Similarly, safety may be implicated if the IC 100 malfunctions in some embodiments, but in other embodiments, safety may not at all be an issue.

The CPUs 102 may execute software stored in memory 106 to perform the various functions designed for the IC 100. As desired, direct memory accesses can be performed by the DMA engine 104.

The electronic device 90 preferably has multiple I/O pins 114. The peripheral interface 110 receives signals from, for example, a CPU 102 for transmission as output signals through one or more of the I/O pins 114. In some embodiments, a CPU 102 can be used to program the peripheral interface 110 as to which signals are to be routed through specific I/O pins 114. The IC 100 comprises mux logic 112 associated with each I/O pin 114. Each mux logic 112 may receive any of multiple signals earmarked for transmission as output signal through the corresponding I/O pin.

In accordance with various embodiments of the invention, the IC 100 is capable of testing mux logic 112. The mux logic 112 is instrumental to implementing pin muxing in electronic device 90, and testing the mux logic 112 helps to ensure that the device operates properly. FIGS. 2-5 provide various embodiments of mux logic 112 and are discussed below.

Figure 2:
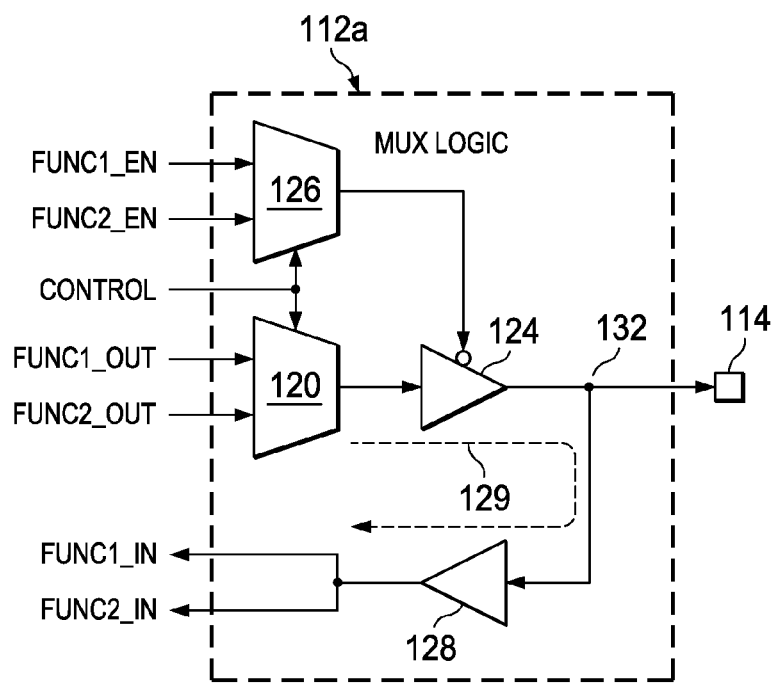
FIG. 2 shows an example of mux logic associated with a given I/O pin in accordance with various embodiments.

FIG. 2 shows mux logic 112a comprising multiplexers 120 and 126, gated output buffer 124, and a receive input buffer 128. The mux logic 112a shown in FIG. 2 (as well as the mux logic shown in FIGS. 3-5) represents logic that transmits output signals to, and receives input signals from, a single pin on electronic device 90. Additional I/O pins 114 may have their own additional mux logic as well.

Multiplexer 120 has multiple inputs and can be operated via a CONTROL signal to provide a selected signal on one of the inputs as an output signal from the multiplexer. The output from mux 120 is provided to an input of gated output buffer 124. The output from the gated output buffer is provided to pin 114. As such, a select input signal from the mux 120 is provided to the pin 114.

The mux 120 is shown as having two inputs with data signals labeled FUNC1_OUT and FUNC2_OUT. In other embodiments, more than two input signals are provided to mux 120. FUNC1_OUT and FUNC2_OUT represent any desired output signals capable of being generated by the IC 100. The CONTROL signal dictates which of the FUNC1_OUT and FUNC2_OUT signals are to be provided as outputs from the mux 120. The CONTROL, FUNC1_OUT and FUNC2_OUT signals are generated by other logic in the IC 100 (e.g., by a CPU 102).

Mux 126 receives enable signals corresponding to the FUNC1_OUT and FUNC2_OUT data signals. The enable signals are labeled as FUNC1_EN and FUNC2_EN. Each enable signal enables gated output buffer 124 when the corresponding data signal is selected via mux 120. That is, when it is desired to transmit FUNC1_OUT data signal from mux 120 to pin 114, FUNC1_EN signal is also selected via mux 126. Preferably, the same CONTROL signal operates mux 126 as mux 120. The selected enable signal is provided to a gate of gated output buffer 124 to enable the buffer to transmit the selected data signal to the corresponding pin 114. Similarly, when it is desired to transmit FUNC2_OUT data signal from mux 120 to pin 114, FUNC2_EN signal is also selected via mux 126. The FUNC1_EN and FUNC2_EN signals preferably also are generated by the same logic (e.g., CPU 102) that asserts the CONTROL, FUNC1_OUT and FUNC2_OUT signals.

Pin 114 may also receive an input signal from a component external to electronic device 90. When pin 114 receives an input signal, gated output buffer 124 is not enabled by any of the enable signals (i.e., gated output buffer is disabled) thereby permitting the input signal to be received and provided to input buffer 128. The output signal from the input buffer 128 represents the input signal received from the external component. By controlling the state of the gated output buffer 124, the mux logic 112a is capable of bidirectional data flow.

The IC 100 is capable of operating in a test mode in which the mux logic 112a is tested. One or more of the CPUs 102 can be used to control the test mode. During the test mode, the use of the I/O pin 114 to send and receive data signals for normal system operation is ceased and, instead test signals are generated and provided to the FUNC1_OUT and FUNC2_OUT inputs to the mux 120. The corresponding enable signals (FUNC1_EN and FUNC2_EN) signals also are generated to permit the corresponding test signals to be provided through to the gated output buffer 124. As shown in FIG. 2, the input buffer 128 receives, as an input, the signal from node 132 (the node between the output of the gated output buffer 124 and the pin 114). Thus, the input buffer 128 receives the test signal from the gated output buffer 124 as a loop-back signal as indicated generally by dashed arrow 129.

The CPU 102 (or other logic) in charge of the test compares the received input signal (FUNC1_IN or FUNC2_EN) to the original test signal on FUNC1_OUT or FUNC2_OUT. If the mux logic 112 is working correctly, the input signal corresponding to the output signal being used for the test signal should match the output signal. For example, if a test signal is provided on the FUNC1_OUT signal, the same signal should be observed on the FUNC1_IN signal. If the signals mismatch, the mux logic 112a is likely to have an error and an error alert can be generated or logged in memory 106. All of the channels of the mux 120 can be tested in this fashion, and in some embodiments, the various mux channels are tested sequentially. The test described herein is referred to as an "internal loop back test."

The test mode can be performed while the device 90 is installed and is in operation in a system in which it helps control and/or monitor. The test can be performed, for example, during system initialization and/or during run-time when an I/O pin 114 is otherwise not being used to send or receive data signals. Further, as there are multiple I/O pins 114 and mux logic 112 corresponding to each such I/O pin, the loop back test can be performed for the mux logic 112 of one pin 114 independent of the other mux logic 112, or all mux logic 112 for all I/O pins 114 can be tested as described herein in parallel. The loop back test performed on mux logic 112a of FIG. 4 tests muxes 120 and 126, gated output buffer 124, and input buffer 128.

While the loop back test described above with regard to mux logic 112a of FIG. 2 advantageously permits the mux logic 112a to be tested while the device 90 in place in the system in which the IC 100 is embedded, a disadvantageous of the loop back test of FIG. 2 is that each test signal, not only is internally looped back to the FUNC1_IN and FUNC2_IN inputs, but also is transmitted out the I/O pin 114. This means that the external device to which the I/O pin is connected also receives the test signals. This may or may not be a problem. In some embodiments, the external logic may be informed by a separate signal that the IC 100 is about to undergo a test and to ignore all signals received pin 114. During loop back testing when the input buffer 128 receives a looped back signal from node 132, no external input signals are received at pin 114 because the IC 100 schedules its loop back testing around normal system activity and thus when no external signals are expected to be received anyway.

Figure 3:
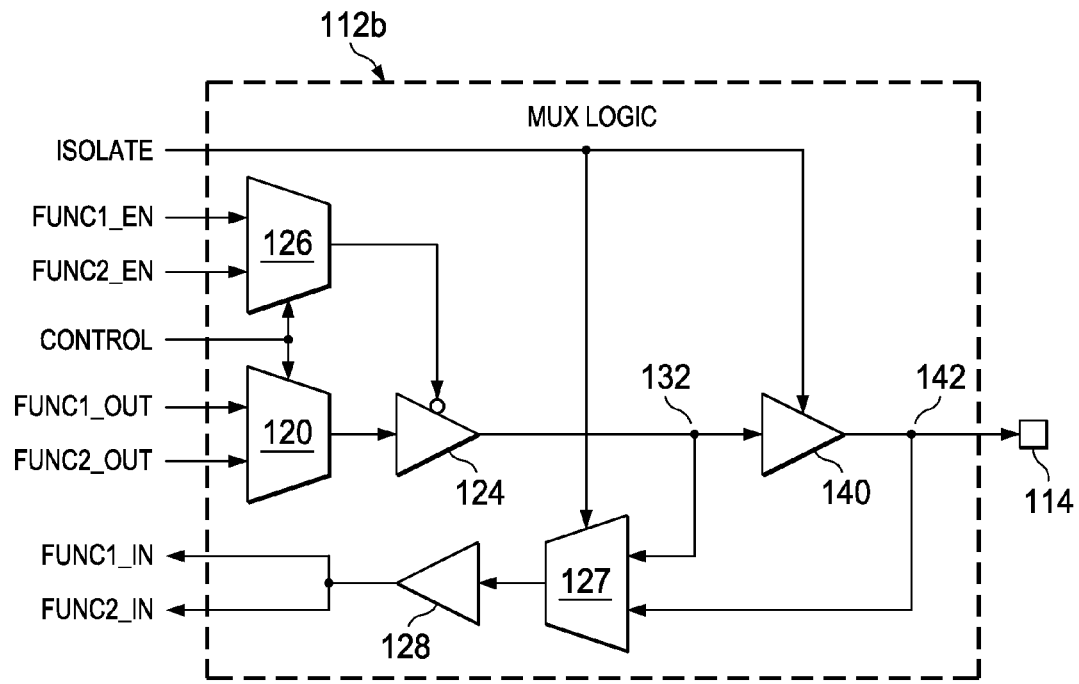
FIG. 3 shows another example of mux logic associated with a given I/O pin in accordance with various embodiments.

FIG. 3 provides another example of mux logic 112 (shown as mux logic 112b in FIG. 3). Mux logic 112b in FIG. 3 is largely the same as mux logic 112a from FIG. 2 with one exception. Mux logic 112b in FIG. 3 includes an extra gated output buffer 140 connected in series between gated output buffer 124 and the I/O pin 114. The gated output buffer 140 is controlled by an ISOLATE signal that is asserted by, for example, the CPU 102 that controls the loop back test of mux 112b. In one digital state, the ISOLATE signal enables the gated output buffer 140 to provide the signal received from gated output buffer 124 to the I/O pin. In the other digital state, the ISOLATE signal causes the gated output buffer 140 to block any signal on its input from being provided to the I/O pin 114. During a loop back test, the ISOLATE signal is asserted to the state in which the gated output buffer 140 blocks its input signal from reaching pin 114. As such, the gated output buffer 140 can block all test signals from reaching in 114 and thus from reaching any external logic connected to pin 114. As such, internal loop back testing using mux logic 112b can occur without impacting external logic connected to the pins 114 of the device.

The input buffer 128 is capable of receiving as input the signal at node 132 (node between output of gated output buffer 124 and input of gated buffer 140), as well as the signal on node 142 by way of a multiplexer 127 controlled by the ISOLATE signal. During the loop back test, the input buffer receives a looped back test signal from node 132 for comparison as noted above. During normal run-time operation, an input signal received at pin 114 is routed to the input buffer 128. During normal run-time operation in which the input buffer 128 receives an input signal from pin 114, the gated output buffer 124 is disabled thereby preventing the occurrence of signal on node 132. During loop back testing when the input buffer receives a looped back signal from node 132, no external input signals are received at pin 114 because the IC 100 schedules its loop back testing around normal system activity and thus when no external signals are expected to be received anyway. The loop back test performed on mux logic 112b of FIG. 3 tests muxes 120 and 126, gated output buffer 124, and input buffer 128.

Figure 4:
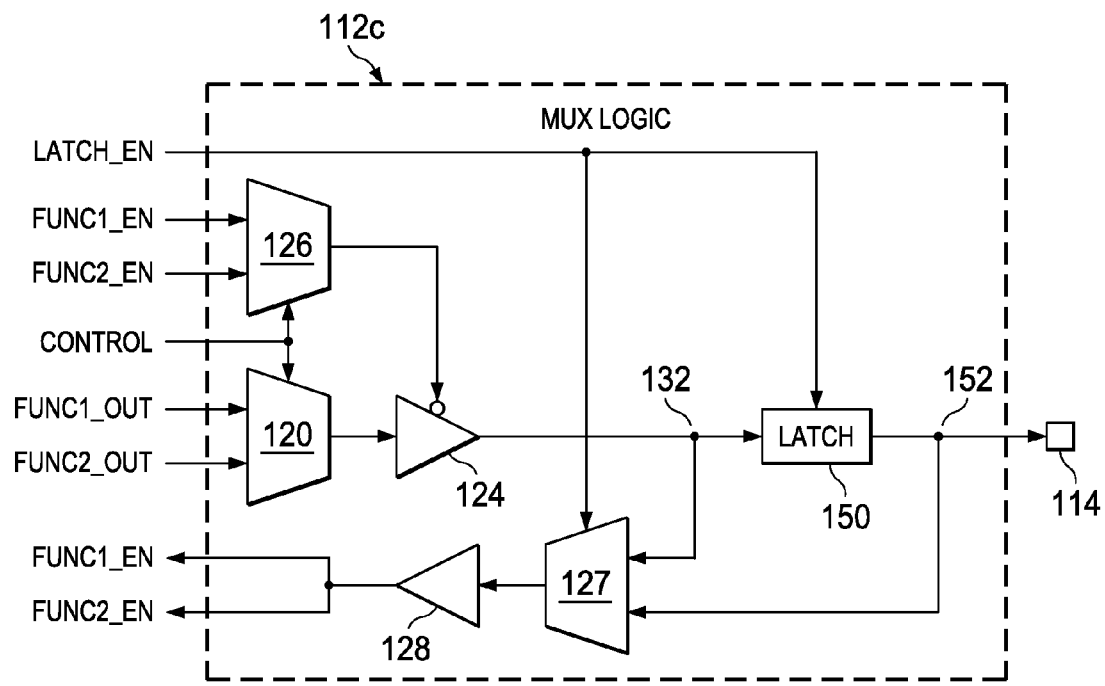
FIG. 4 shows yet another example of mux logic associated with a given I/O pin in accordance with various embodiments.

FIG. 4 illustrates another embodiment of mux logic 112 (depicted as mux logic 112c in FIG. 4). In the example of FIG. 4, the gated output buffer 140 of FIG. 3 has been replaced with a latch 150. A LATCH_EN signal (generated by the CPU 102 controlling the loop back test) causes the latch 150 to latch, for example, the state of the particular output signal (FUNC1_OUT or FUNC2_OUT) that is driven out I/O pin 114 just before the loop back test begins (i.e., the output signal through I/O pin 114 that is being asserted when it is desired to perform a loop back test of the mux logic. With the output data signal being latched, the latched signal state continues to be driven out the I/O pin despite the various test signals on the FUNC1_OUT and FUNC2_OUT inputs to mux 120 changing state due to the loop back test. As such, external logic connected to the I/O pins need not be effected by the occurrence, or even aware, of loop back testing in the IC 100. Preferably, the length of time of the loop back test does not exceed the length of time that a give I/O pin 114 is to be driven by a particular data output signal. As such, if during the period of time that an external device is driven by a particular data output signal from an I/O pin, the loop back test begins and completes for that pin's mux logic 112c, the external device will be unaffected by the test.

Once the internal loop back test has completed, the LATCH_EN signal changes state to again permit normal data output signals from the mux 120 to pass through the latch 150 to the I/O pin 114.

All run-time input signals to pin 114 are routed from node 152 (which is the node between the latch 150 and the in pin 114) to the input of input buffer 128. During a loop back test, the test signal on node 132 is provided to the input buffer 128 via multiplexer 127 (controlled by LATCH_EN) for comparison against the corresponding output test signal. As pin 114 is being used to drive a latched output signal, the output signal on pin 114 is unaffected by the loop back test. The loop back test performed on mux logic 112c of FIG. 4 tests muxes 120 and 126, gated output buffer 124, and input buffer 128.

Figure 5:
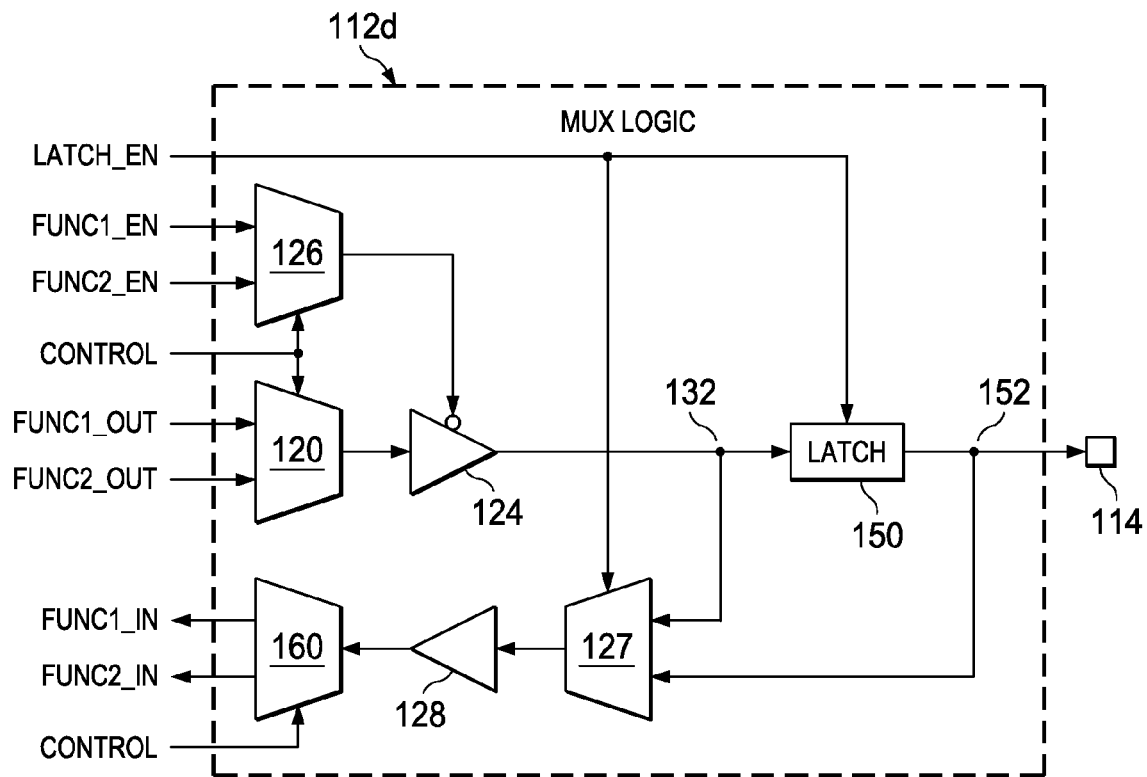
FIG. 5 shows yet another example of mux logic associated with a given I/O pin in accordance with various embodiments.

FIG. 5 illustrates another embodiment of mux logic 112 (depicted as mux logic 112d in FIG. 5). The mux logic 112d of FIG. 5 is largely the same as mux logic 112c of FIG. 4 with the addition of an input demultiplexer (demux) 160. The demux 160 receives input data signals from pin 114 via input buffer 128 and demultiplexes the signals to provide the individual input signals on the appropriate FUNC1_IN and FUNC2_IN input lines. Demux 160 is controlled by a control signal (e.g., the same, or different, CONTROL signal that controls muxes 120 and 126). The loop back test performed on mux logic 112d of FIG. 5 also tests the demux 160 and its channels as well as muxes 120 and 126, gated output buffer 124, and input buffer 128.

Figure 6:
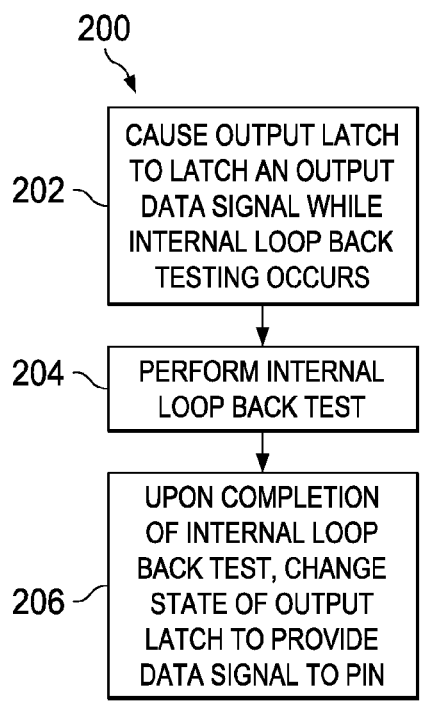
FIGS. 6 and 7 illustrate methods in accordance various embodiments of the invention regarding the operation of various mux logic circuits.

FIG. 6 illustrates a method 200 in accordance with the operation of mux logic 112c and 112d of FIGS. 4 and 5. The actions depicted in method 200 may be performed in the order shown or in a different order. Further, the actions may be performed sequentially or various actions of the method may be performed in parallel. The method are performed and/or controlled by, for example, a CPU 102.

At 202, the method comprise causing the output latch 150 to latch an output data signal while internal loop back testing occurs. At 204, the method includes performing internal loop back testing. Such internal loop back testing may include providing a test signal to the mux 120, looping the test signal from an output of the mux 120 back to input buffer 128, and comparing the looped back test signal to the provided test signal to check for an error. A mismatch between the original test signal provided to mux 120 and the looped back signal is indicative of an error which can be recorded to a log or an alert can be generated (e.g., assert an interrupt signal, flag, etc.). At 206, upon completion of the internal loop back test, the method comprises causing a state of the output latch to change thereby providing a data signal to an I/O pin instead of a test signal. The method of FIG. 6 may be repeated for each input of the mux 120.

Figure 7:
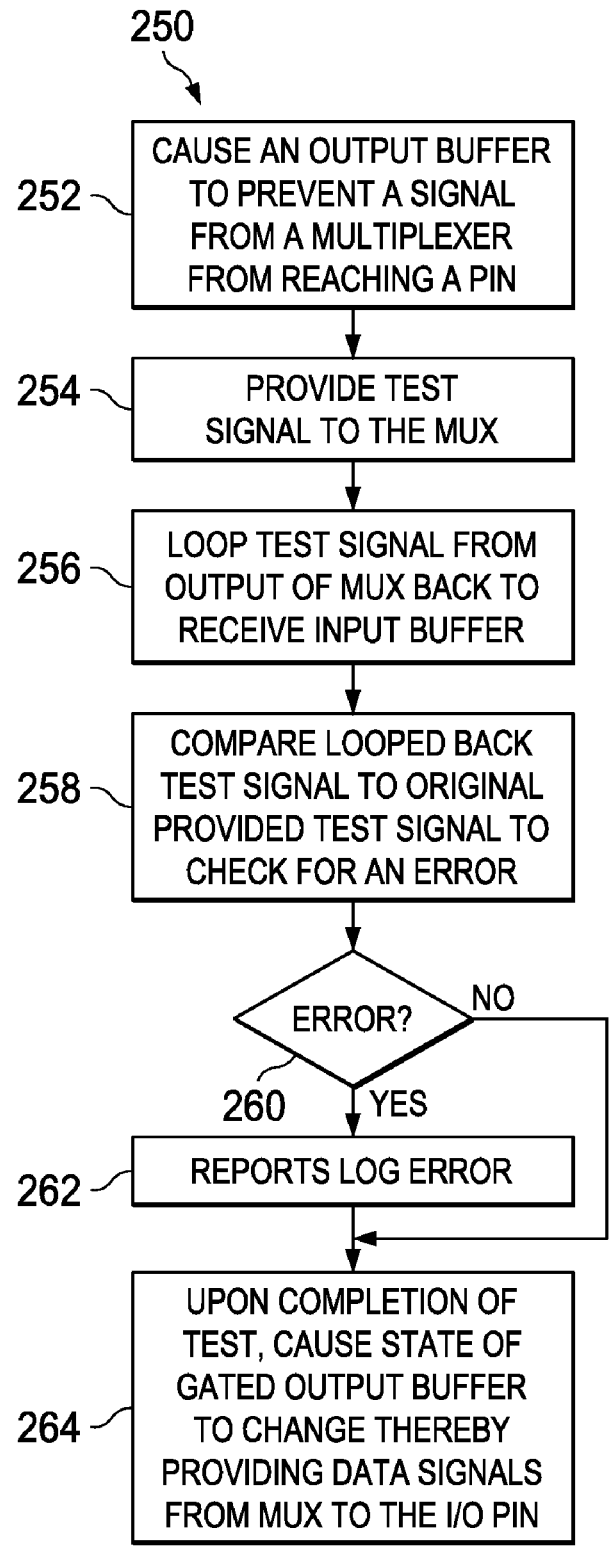

FIG. 7 illustrates a method 250 in accordance with the operation of mux logic 112b of FIG. 3. The actions depicted in method 250 may be performed in the order shown or in a different order. Further, the actions may be performed sequentially or various actions of the method may be performed in parallel. The actions may be performed sequentially or various actions of the method may be performed in parallel. The method are performed and/or controlled by, for example, a CPU 102.

At 252, method 250 comprises causing an output buffer to prevent a signal from the mux 120 from reaching the I/O pin 113. In some embodiments, this action is performed by asserting the ISOLATE signal to the gated output buffer 140. At 254, a test signal is provided to one of the channels of mux 120. The test signal is then looped back through the mux 120 and gated output buffer 124 to the input buffer 128 (256) and at 258 the looped back test signal is compared to the original test signal provided to mux 120. Decision 260 determines that an error has occurred if the signals do not match. If an error is deemed to have occurred, then at 262, the error is reported (e.g., an error signal such as an interrupt or flag) is asserted by device 90, or the error is recorded into a log in memory 106. Regardless of whether or not an error has been detected, at 264, method 250 comprises that, upon completion of the test, the state of gated output buffer is caused to change thereby providing data signals from mux 120 to the I/O pin 114 in accordance normal run-time operation of device 90. The method of FIG. 7 may be repeated for each channel of the mux 120.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An integrated circuit, comprising:
a first multiplexer (mux) with multiple inputs and configured to produce a mux output signal;
a first gated buffer configured to receive the mux output signal from the first multiplexer and produce a first gated buffer output signal;
a second gated buffer configured to receive the first gated buffer output signal and configured to produce a second gated buffer output signal to be provided to a pin; and
a receive input buffer configured to be coupled to said pin and configured to receive an input signal from said pin;
wherein said integrated circuit operates in a test mode in which the second gated buffer is disabled thereby preventing a test signal provided to an input of the first mux from reaching the pin, the test signal provided instead through the first mux to the first gated buffer and to the receive buffer thereby testing at least the first mux.

2. The integrated circuit of claim 1 wherein, while in the test mode, a plurality of test signals are provided sequentially to the inputs of the first mux to test each of multiple channels in the first mux.

3. The integrated circuit of claim 1 further comprising a second mux configured to provide an enable signal to the first gated buffer, said second mux controlled during the test mode to enable the first gated buffer to control timing of the test signal to the receive input buffer.

4. The integrated circuit of claim 1 wherein, during said test mode, no signals are driven by the integrated circuit on the pin.

5. An integrated circuit, comprising:
a first multiplexer (mux) with multiple inputs and configured to produce a mux output signal;
a gated buffer configured to receive the mux output signal from the first multiplexer and produce a gated buffer output signal;
a latch configured to receive the gated buffer output signal and configured to produce a latched output signal to be provided to a pin; and
a receive input buffer configured to be coupled to said pin and configured to receive an input signal from said pin;
wherein said integrated circuit operates in a test mode in which the latch is configured to latch the gated buffer output signal to be provided to said pin as an output signal from said pin while a test signal is provided to an input of the mux from reaching the pin, the test signal provided instead through the mux to the gated buffer and to the receive input buffer without the test signal being provided to said pin.

6. The integrated circuit of claim 5 further comprising a demultiplexer coupled to an output from said receive input buffer, said demultiplexer configured to demultiplex a signal from said receive buffer, wherein the test mode tests multiple channels of the first mux and the demultiplexer.

7. The integrated circuit of claim 5 further comprising a second mux whose output signal is an enable signal to the gated buffer.

8. A method of performing a loop back test on multiplexer logic in an integrated circuit, said multiplexer logic containing an multiplexer and coupled to an input/output pin for multiplexing data output signals to said pin, said method comprising;
causing an output latch to latch an output signal from a multiplexer to perpetuate said output signal from said multiplexer at the pin while internal loop back testing occurs;
performing an internal loop back test by providing a test signal to the multiplexer, looping the test signal from an output of the multiplexer back to a receive buffer, and comparing the looped back test signal to the provided test signal to check for an error; and
upon completion of the internal loop back test, causing a state of the output latch to change thereby to provide a data signal from said multiplexer to said pin.

9. The method of claim 8 further comprising not providing the test signal to the pin while performing the internal loop back test and instead driving the latch's output signal on to the pin.

10. The method of claim 8 wherein the multiplexer comprises a plurality of inputs and wherein performing the internal loop back test comprises providing a test signal to each input of the multiplexer and comparing each such looped back test signal to each corresponding provided test signal to check for an error.

11. A method performing a loop back test on multiplexer logic in an integrated circuit, said multiplexer logic containing an multiplexer and coupled to an input/output pin for multiplexing data output signals to said pin, said method comprising:

causing an output gated buffer to prevent a signal from the multiplexer from reaching a pin;

providing a test signal to the multiplexer;

looping the test signal from an output of the multiplexer back to a receive input buffer;

comparing the looped back test signal to the provided test signal to check for an error; and upon completion of a test, causing a state of the gated output buffer to change thereby to provide a data signal from said multiplexer to said pin.

12. The method of claim 11 wherein the multiplexer comprises a plurality of inputs and wherein providing the test signal to the multiplexer, looping the test signal, and comparing the looped back test signal to the provided test signal is repeated for each input of the multiplexer.

* * * * *